(12) United States Patent
Yang (10) Patent No.: US 7,586,779 B2
(45) Date of Patent: Sep. 8, 2009

(54) CONTROLLER APPARATUS FOR UTILIZING DOWNGRADE MEMORY AND METHOD FOR OPERATING THE SAME

(76) Inventor: Chang-Lien Ou Yang, 11/F No. 10, Lane 30, Qingnian Rd., Wanhua District, Taipei City 108 (TW)

( * ) Notice: Subject to any disclaimer, the term of this patent is extended or adjusted under 35 U.S.C. 154(b) by 214 days.

(21) Appl. No.: 11/392,301

(22) Filed: Mar. 28, 2006

(65) Prior Publication Data

US 2006/0221733 A1    Oct. 5, 2006

(30) Foreign Application Priority Data

Mar. 30, 2005    (TW) .............................. 94110012 A (51) Int. Cl.
*G11C 11/24* (2006.01)
(52) U.S. Cl. .................. 365/149; 365/200; 365/233.13
(58) Field of Classification Search ................ 365/200, 365/145, 185.09, 149
See application file for complete search history.

(56) References Cited

U.S. PATENT DOCUMENTS 5,122,987 A * 6/1992 Kihara ........................ 365/200
6,115,828 A * 9/2000 Tsutsumi et al. ............... 714/7
6,137,745 A * 10/2000 Lin et al. ............... 365/230.03
6,285,607 B1 * 9/2001 Sinclair ....................... 365/200
6,381,708 B1 * 4/2002 Larsen et al. .................. 714/8
2003/0145250 A1 * 7/2003 Chin ........................... 714/30
2004/0145939 A1 * 7/2004 Yoshida et al. .............. 365/145

* cited by examiner

*Primary Examiner*—Vu A Le
*Assistant Examiner*—Han Yang (57) ABSTRACT

A controller apparatus for utilizing downgrade memory and method for operating the same are proposed. The controller apparatus uses address assignment to access the downgrade memory, which is classified by accessible address after testing. The controller apparatus is applicable to various applications, including memory interface controller for the accessing of a sub system. The controller apparatus can be integrated into the sub system within single chip. The controller apparatus further comprises at least one recording unit to record the initialization format and address mapping relation of a specific downgrade memory. Therefore, controller apparatus can be adapted to access various kinds of downgrade memory designated by the recording unit.

17 Claims, 13 Drawing Sheets

FIG.1
PRIOR ART

| Memory number | Bank number | Bank address | Row address number | Column address number |
|---|---|---|---|---|
| 16M 2 bank | | | | |
| 1Mx16 | 2 | 1 | 11 | 8 |
| 2Mx8 | 2 | 1 | 11 | 9 |
| 4Mx4 | 2 | 1 | 11 | 10 |
| 64M 4 bank | | | | |
| 2Mx32 | 4 | 2 | 11 | 8 |
| 4Mx16 | 4 | 2 | 12 | 8 |
| 8Mx8 | 4 | 2 | 12 | 9 |
| 16Mx4 | 4 | 2 | 12 | 10 |
| 128M 4 bank | | | | |
| 4Mx32 | 4 | 2 | 12 | 8 |
| 8Mx16 | 4 | 2 | 12 | 9 |
| 16Mx8 | 4 | 2 | 12 | 10 |
| 32Mx4 | 4 | 2 | 12 | 11 |
| 256M 4 bank | | | | |
| 8Mx32 | 4 | 2 | 13 | 8 |
| 16Mx16 | 4 | 2 | 13 | 9 |
| 32Mx8 | 4 | 2 | 13 | 10 |
| 64Mx4 | 4 | 2 | 13 | 11 |

| S2,1,0 | BA | | RA | | | | | | | | | | | | | CA | | | | | | | | |
|---|---|---|---|---|---|---|---|---|---|---|---|---|---|---|---|---|---|---|---|---|---|---|---|---|
| | 0 | 1 | 12 | 11 | 10 | 9 | 8 | 7 | 6 | 5 | 4 | 3 | 2 | 1 | 0 | 8 | 7 | 6 | 5 | 4 | 3 | 2 | 1 | 0 |
| L,L,L | 8 | 9 | 22 | 21 | 20 | 19 | 18 | 17 | 16 | 15 | 14 | 13 | 12 | 11 | 10 | 7 | 7 | 6 | 5 | 4 | 3 | 2 | 1 | 0 |
| L,L,H | 8 | 9 | 22 | 21 | 20 | 19 | 18 | 17 | 16 | 15 | 14 | 13 | 12 | 11 | 10 | 7 | L | 6 | 5 | 4 | 3 | 2 | 1 | 0 |
| L,H,L | 8 | 9 | 22 | 21 | 20 | 19 | 18 | L | 16 | 15 | 14 | 13 | 12 | 11 | 10 | 7 | H | 6 | 5 | 4 | 3 | 2 | 1 | 0 |
| L,H,H | 8 | 9 | 22 | 21 | 20 | 19 | 18 | H | 16 | 15 | 14 | 13 | 12 | 11 | 10 | 7 | /17 | 6 | 5 | 4 | 3 | 2 | 1 | 0 |
| H,L,L | 8 | 9 | 22 | 21 | 20 | 19 | 18 | 17 | 16 | 15 | 14 | 13 | 12 | 11 | 10 | 7 | /17 | 6 | 5 | 4 | 3 | 2 | 1 | 0 |
| H,L,H | 8 | 9 | 22 | 21 | 20 | 19 | 18 | 17 | 16 | 15 | 14 | 13 | 12 | 11 | 10 | 7 | /17 | 6 | 5 | 4 | 3 | 2 | 1 | 0 |

FIG.7A

| S3210 | BA | | RA | | | | | | | | | | | | | CA | | | | | | | |
|---|---|---|---|---|---|---|---|---|---|---|---|---|---|---|---|---|---|---|---|---|---|---|---|
| | 0 | 1 | 0 | 1 | 2 | 3 | 4 | 5 | 6 | 7 | 8 | 9 | 10 | 11 | 12 | 0 | 1 | 2 | 3 | 4 | 5 | 6 | 7 |
| HLLL | 8 | 9 | 22 | 21 | 20 | 19 | 18 | 17 | 16 | 15 | 14 | 13 | 12 | 11 | 10 | 0 | 1 | 2 | 3 | 4 | L | 6 | 5 |
| HLLH | 8 | 9 | 22 | 21 | 20 | 19 | 18 | 17 | 16 | 15 | 14 | 13 | 12 | 11 | 10 | 0 | 1 | 2 | 3 | 4 | H | 6 | 5 |
| HLHL | 8 | 9 | 22 | 21 | 20 | 19 | 18 | 17 | 16 | 15 | 14 | 13 | 12 | 11 | 10 | 0 | 1 | 2 | 3 | 4 | 15 | 6 | 5 |
| HLHH | 8 | 9 | 22 | 21 | 20 | 19 | 18 | L | 16 | 15 | 14 | 13 | 12 | 11 | 10 | 0 | 1 | 2 | 3 | 4 | 15 | 6 | 5 |
| HHLL | 8 | 9 | 22 | 21 | 20 | 19 | 18 | H | 16 | 15 | 14 | 13 | 12 | 11 | 10 | 0 | 1 | 2 | 3 | 4 | 15 | 6 | 5 |
| HHLH | 8 | 9 | 22 | 21 | 20 | 19 | 18 | 17 | 16 | 15 | 14 | 13 | 12 | 11 | 10 | 0 | 1 | 2 | 3 | 4 | /15 | 6 | 5 |

CONTROLLER APPARATUS FOR UTILIZING DOWNGRADE MEMORY AND METHOD FOR OPERATING THE SAME

BACKGROUND OF THE INVENTION

1. Field of the Invention

The present invention relates to a memory controller and an operating method for the same, especially to a memory controller for using a downgrade memory with initialization step and an operating method for the same

2. Description of Prior Art

Figure 1:
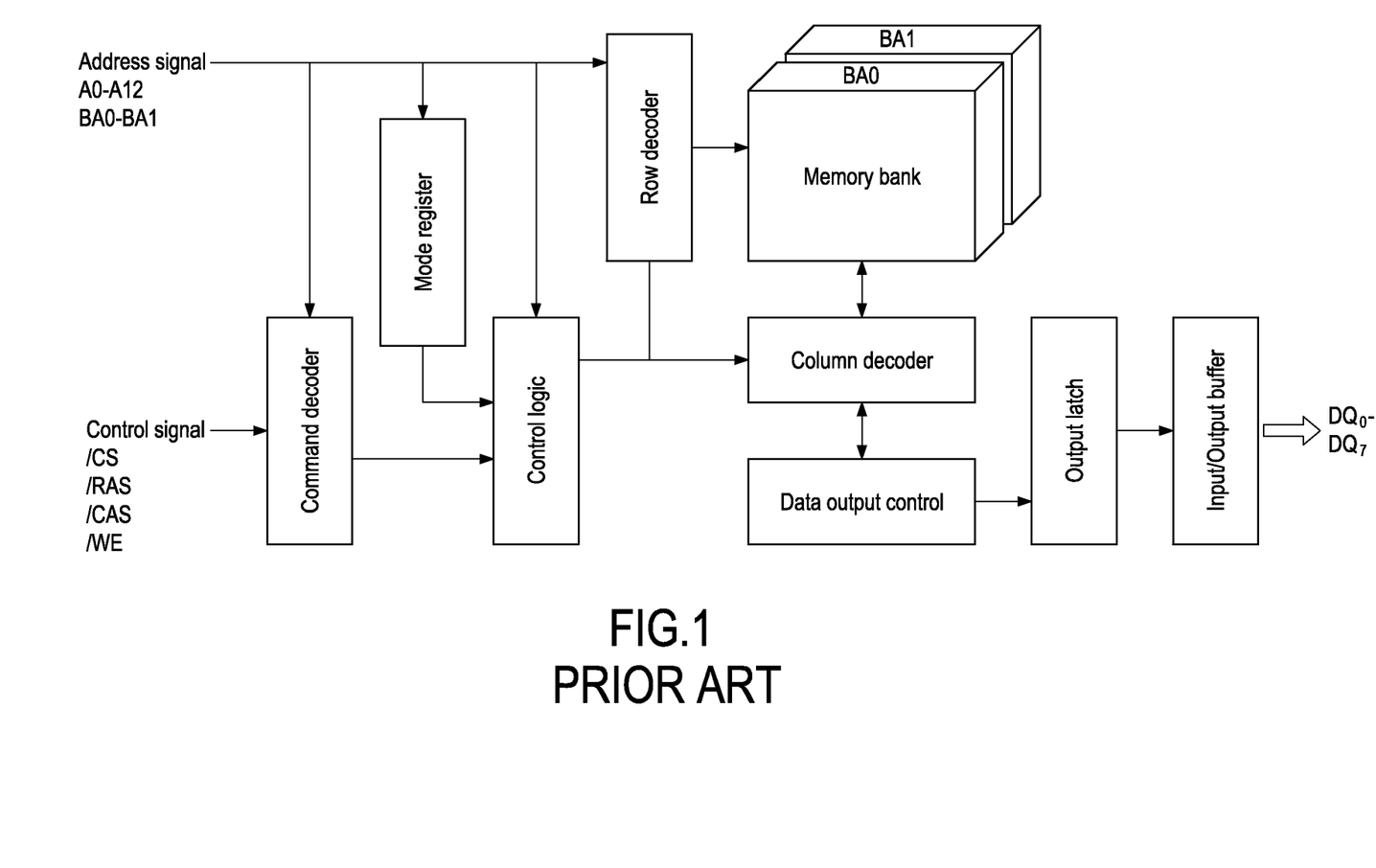
FIG. 1 shows a block diagram of a conventional DDR SDRAM.

FIG. 1 shows a block diagram of a conventional DDR SDRAM, which exemplifies a prevailing DRAM structure since the commencement of SDRAM. The shown memory is divided into a plurality of banks selected by bank address. The memory cells in each bank are accessed through a plurality of column addresses and a plurality of row addresses. As also shown in this figure, the column addresses and the row addresses are generally accessed in multiplexing way as the capacity size of DRAM memory increases. Taking a 256M (32M*8) memory as example, all the address pins A0-A12 in address bus shown on left-top side of FIG. 1 are allocated to row address, while part of the address bus (for example, A0-A9) are allocated to column address in multiplexing fashion to save pin count. As also shown in FIG. 1, the bus of the memory also comprises bank address BA0, BA1 to select memory bank, control signal pins /CAS, /RAS, /WE, and /CS (where slash "/" indicated inverted active signal) and data signal pins DQ0-DQ7. The address pins A0-A12 and BA0, BA1 can also be used for setting mode registers besides addressing.

Figure 2:
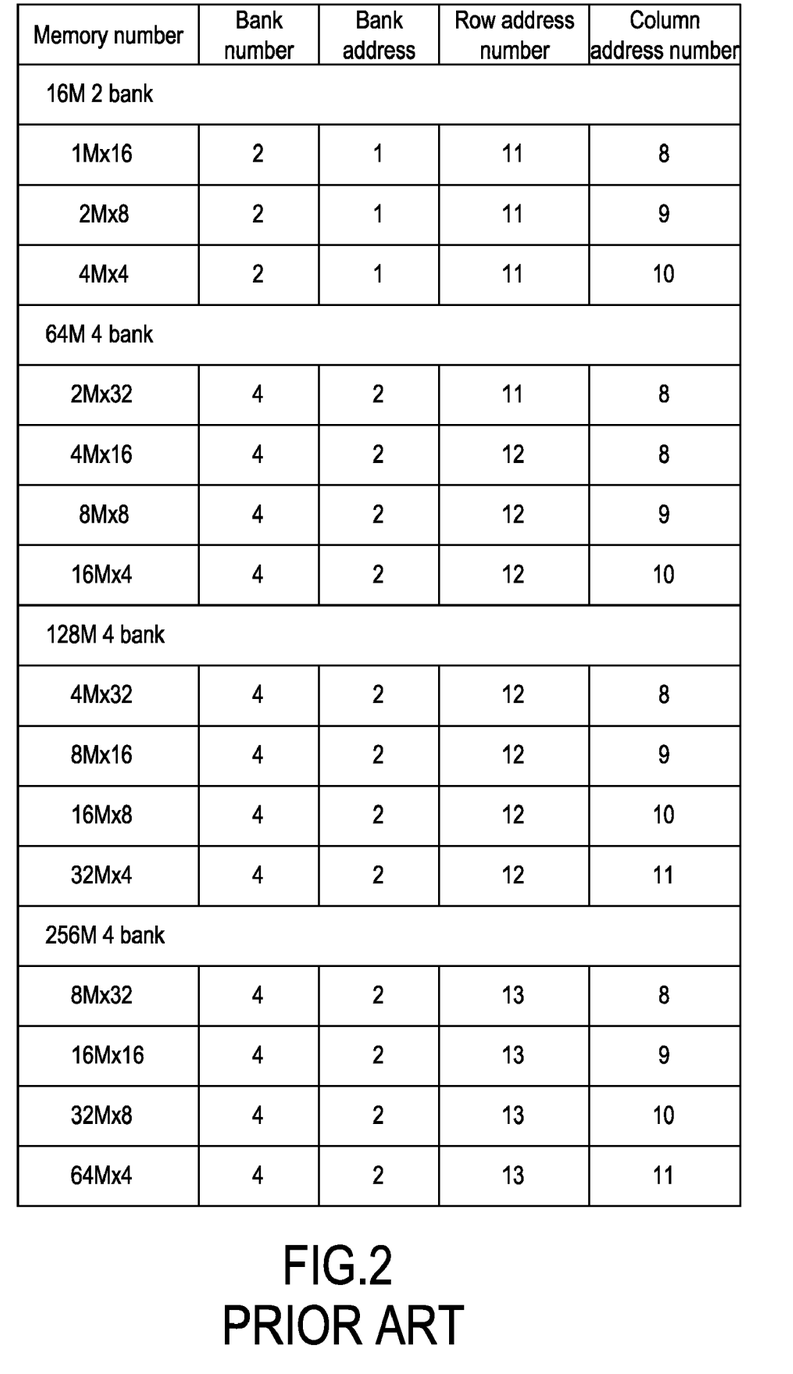
FIG. 2 shows an allocation table for row address, column address and bank address of a standard SDRAM memory.

FIG. 2 shows an allocation table for row address, column address and bank address of a standard SDRAM memory. Taking also the 256M (32M*8) memory as example, the address pin setting for row address, column address and bank address is (2, 13, 10). As can be seen from FIG. 2, the pin counts of the SDRAM memory has specific regulation for correctly accessing the SDRAM memory through a memory controller.

As the progress of semiconductor technology, the capacity of DRAM memory is also rapidly increased. The current operation system also has capability to access memory larger than 4G bytes and the capacity of the commercially available memory is generally larger than 128 M bytes. Semiconductor memories are generally subjected to a test step after manufacture. If the defect of the memory is not serious after examination by the test step, the error can be corrected by redundant memory cells before package of the memory. However, if the defect of the memory is serious, the error cannot be corrected by redundant memory cells. The defected memory will be dropped or used as downgrade memory. In the downgrade memory, only accessible portion in the memory is used and the storage capacity is generally smaller than the normal capacity.

The applications of the conventional downgrade memory have following three ways, or the combination thereof.

Figure 3A:
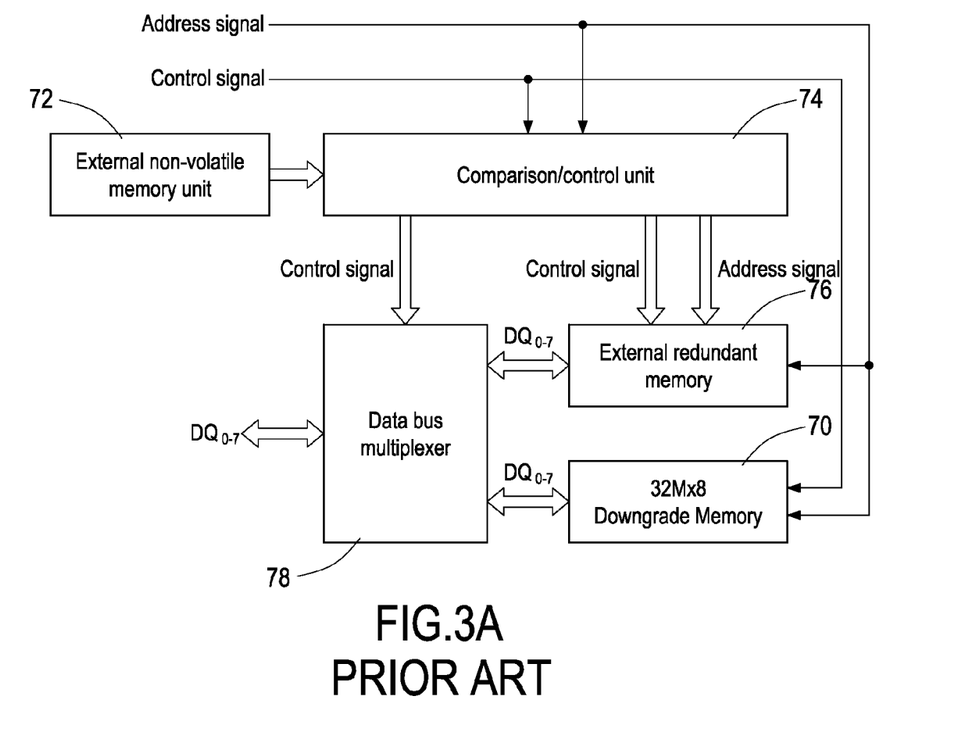
FIG. 3A shows the first conventional way to use downgrade memory.

As shown in FIG. 3A, in the first conventional way to use downgrade memory, an external redundant memory 76 is used to correct the error of the downgrade memory 70. An external non-volatile memory unit 72 is used to record the defect location and used for the reference of the external redundant memory 76. The external non-volatile memory unit 72 can be realized by, for example, EEPROM or Flash memory and the external redundant memory 76 can be realized by, for example, SRAM or DRAM memory. The external redundant memory 76 can be integrated into ASIC or independently arranged. A comparison/control unit 74 compares an accessing address with defect location and the comparison result is used to control a data bus multiplexer 78 to determine whether the output will be generated by the external redundant memory 76. An alternative way is to use the comparison/control unit 74 to control the DM/DQM signal of memory 70 to control the output from the memory 70 and the external redundant memory 76. The first conventional way has a disadvantage of higher cost caused by the high speed and complicated comparison/control unit 74. The comparison/control unit 74 may need to integrate with the external redundant memory 76 to the same ASIC. However, the use of data bus multiplexer 78 to intercept data bus or the use of DM/DQM signal of memory 70 will cause bus contention problem. The accessing speed of the downgrade memory is limited. Moreover, the use of non-volatile memory unit 72 to record the defect location and the complexity in the comparison/control unit 74 will limit the application of the first conventional way to downgrade memory with less defect.

Figure 3B:
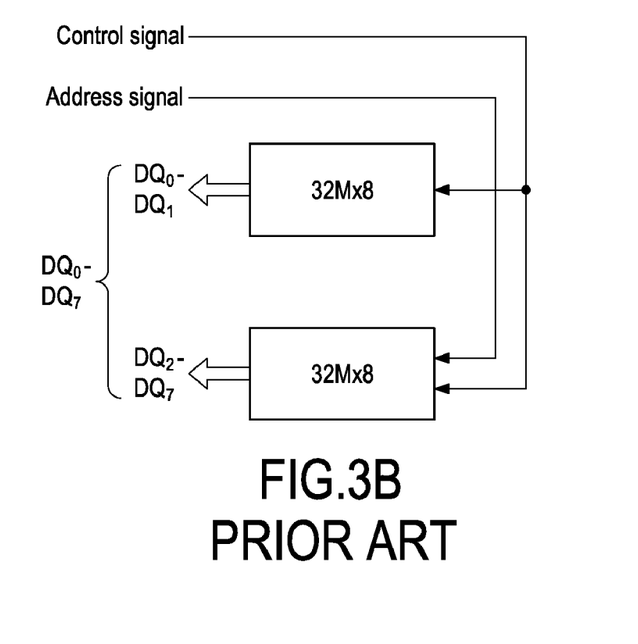
FIG. 3B shows the second conventional way to use downgrade memory.

The second conventional method involves data line division, where the defected areas are precluded in terms of data line DQ. With reference to FIG. 3B, where two 32M*8 SDRAMs are tested and sorted and are used with 32M*1 bit DQ line. For example, if one 32M*8 SDRAM has available area of 32M*2(DQ0-DQ1) and another 32M*8 SDRAM has available area of 32M*6(DQ2-DQ7), the available 2+6=8 DQ lines can be drawn from the two SDRAMs such that a 32M*8 SDRAM is simulated. This method has the advantage of low cost. However, the utilization rate thereof is limited, because the division based on the 32M*1 bit DQ is not compatible with global area layout inside the memory. For example, when all 8 bits for one address are malfunctioned, this defected memory cannot be used as downgrade memory by this method even though this defect is minor.

Figure 3C:
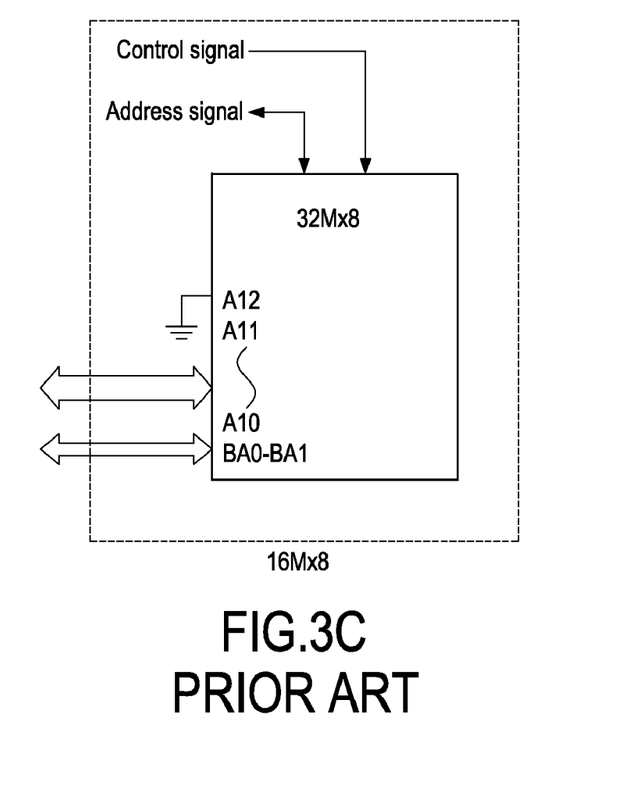
FIG. 3C shows the third conventional way to use downgrade memory.

The third conventional method uses address line division to preclude the defected area in terms of address line. Taking a 32M*8 DRAM as example (as shown in FIG. 2, the pin setting is Bank*Row*Column=2*13*10), the defected area for this DRAM is corresponding to the portion with Row address A12 being High after test. In other word, the defected area will never be accessed if the Row address A12 is kept pulling High. In this situation, as shown in FIG. 3C, the defected area can be precluded by always pulling low the physical address line A12. With reference also to FIG. 2, the memory downgraded in this way can be used as a standard 16M*8 DRAM. This downgrade method has the advantage of versatile variation because the address line has large amount. The variation can also be applied to pull High/Low, address inversion etc. The downgrade method can be performed for one fold downgrade or two fold downgrade (32M*8 down to 8M*8) or more folds. However, the downgrade method has the disadvantage of involving ASIC for address conversion. If the address line to be processed is not an exclusive address line, namely, the address line is multiplexed for row address and column address; ASIC is needed for address conversion. Moreover, the downgraded memory may not be a standard DRAM after address line division. For example, a 16M*8 DRAM (Bank*Row*Column=2*12*10) is downgraded by pulling low the A11 address line, however, this downgraded memory is not a standard DRAM as can be reference to FIG. 2. Therefore, an ASIC is needed to convert the signal of the downgraded memory to simulate an 8M*8 DRAM with pin assignment Bank*Row*Column=2*12*9. Moreover, for advanced DRAM memory such as SDRAM and its successors, the address lines there are also used for initialization commands such as MRS, EMRS commands. Therefore, additional ASIC is needed for signal conversion, which can be referred to Taiwan Patent No. 198183. This patent is also filed by the same applicant as the present invention.

However, the above-mentioned related art has the disadvantages of high cost and signal delay to hinder high-speed application. Moreover, various ASICs are needed for different address conversion schemes, this is inflexible. Moreover, the above-mentioned related art downgrade method is limited to certain conversion, for example, column address reduction instead of column address augmentation.

SUMMARY OF THE INVENTION

It is the object of the present invention to provide a memory controller for downgrade memory to overcome above-mentioned problem. The utilization rate can be increased and with extremely low delay and low cost.

According to a preferred embodiment of the present invention, the memory controller is provided between a downgrade memory and a memory requester. Herein several items are defined to better understand the following. The term "non-defect area" is referred to a cell group without any defect. The term "defect area", is referred to a cell group which at least covers all defect cells. The memory controller sends initialization signals to the downgrade memory according to pin setting of the downgrade memory. The memory controller helps the memory requester to access at least a subset of the non-defect area of the downgrade memory according to memory space requested by the memory requester.

Preferably, the memory controller according to a preferred embodiment of the present invention sends predetermined signals to downgrade logical addresses of the downgrade memory according to a downgrade type setting. The predetermined signals can be directly pulling high/low according to the downgrade type setting or some specific signals or the logic combination thereof.

Preferably, the memory controller according to a preferred embodiment of the present invention comprises a recording unit to record the information of available logical address, correct initialization command and downgraded status. The recording unit can be implemented by jumper, connection status of resistor or EEPROM.

The memory controller according to the present invention can be easily applied to most current commercially available memory. The downgrade addresses can be bank addresses, row address and column addresses precluded with burst length range. The memory controller according to the present invention can be easily applied to full page burst memory (for example, frame buffer memory) as long as the page size of the downgrade memory is larger than the requested page size.

BRIEF DESCRIPTION OF DRAWING

The features of the invention believed to be novel are set forth with particularity in the appended claims. The invention itself however may be best understood by reference to the following detailed description of the invention, which describes certain exemplary embodiments of the invention, taken in conjunction with the accompanying drawings in which:

DETAILED DESCRIPTION OF THE INVENTION

In any application system using memory, a memory controller is employed to facilitate one or more sub-system to access the memory. The sub-system is referred to as Memory Requester hereinafter for clarity. The portion of the memory controller, which faces the memory, is referred to as Front-End. The portion of the memory controller, which faces the memory requester, is referred to as Back-End hereinafter for clarity. The memory controller has versatile functions such as memory refresh, switch and trace of memory page, initialization control of memory and mapping relationship between front-end and back-end.

In the prior art downgrade memory, one or more downgrade memory is used to simulate a standard memory for the accessing of memory controller. In the present invention, the memory controller has a built-in initialization control and provides mapping relationship between front-end and back-end for downgrade memory.

Figure 4A:
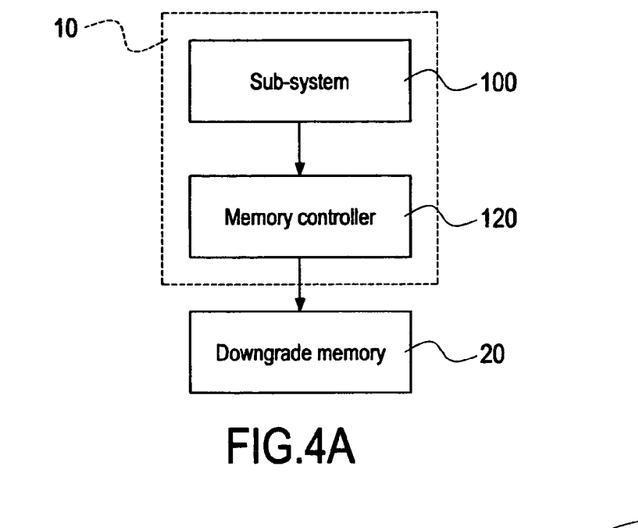
FIG. 4A shows a schematic diagram of a first preferred embodiment of the present invention.

FIG. 4A shows a schematic diagram of a first preferred embodiment of the present invention. The present invention can be applied to any electronic system 10 needing to access memory. As shown in this figure, the electronic system 10 comprises one or more sub-systems 100 and the sub-systems 100 accesses a downgrade memory 20 through the help of a memory controller 120.

Figure 5:
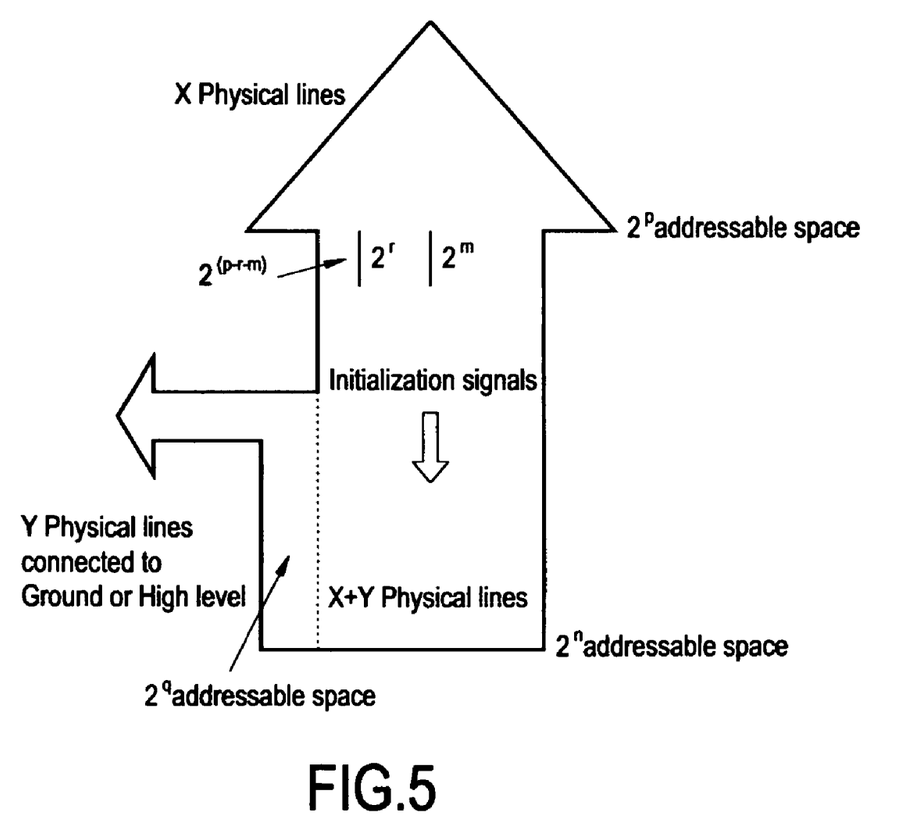
FIG. 5 demonstrates the working principle of the first preferred embodiment of the present invention.

FIG. 5 demonstrates the working principle of the first preferred embodiment of the present invention, where the sub-systems 100 needs memory with $2^m$ addressable space, namely, m logical address lines. A memory 20 with $2^n$ addressable space (namely the memory 20 has n logical addresses including bank address, row address and column address), the available capacity after address line division needs to exceed $2^m$ bits.

In this example, q logical addresses ($q \geq 0$) in the Y physical lines are the logical address for downgrade division (hereinafter, the q logical addresses are referred to as first downgrade logical addresses) and the downgrade command and initialization commands for those q logical address do not need logic gate, namely, the physical address lines corresponding to the q logical address can be directly connected to ground level or high level. Moreover, the X physical lines for the remaining (n−q)=p logical address lines are linked to the memory controller 120, where the p logical addresses are referred to as linked logical addresses. In the p logical addresses, there are r logical addresses (r>0) and (p−r)≧m, where the r logical addresses are referred to as second downgrade logical addresses. When the memory controller 120 sends initialization commands for the memory 20, the memory controller 120 sends correct signal satisfied with standard through the X physical lines according to initialization needs and a pin setting of the downgrade memory. In memory accessing stage, the memory controller 120 helps to access m requested logical addresses, while the memory controller 120 sends suitable signal for the r second downgrade logical addresses according to the downgrade type setting. For the (p−r−m) unused logical addresses, the memory controller 120 sends predetermined signal for those logical addresses. The (p−r−m) unused logical addresses can also be treated as downgrade logical addresses for simplification.

The downgrade type setting imposes limitation on applicable signals for certain logical addresses to prevent from using the defect area in the downgrade memory. When the first and the second downgrade logical addresses of the downgrade memory are applied with signals complied with the downgrade type setting in data-accessing stage, the defect area can be prevented from accessing. In above-mentioned preferred embodiment, the first downgrade logical addresses (the q logical addresses) are not processed through the memory controller 120. The second downgrade logical addresses (the r logical addresses) are processed through the memory controller 120. The memory cells corresponding to the (p−r−m) unused logical addresses are beyond the requirement of the memory requester. Therefore, the (p−r−m) unused logical addresses can be treated as the second downgrade logical addresses for simplification.

Figure 6:
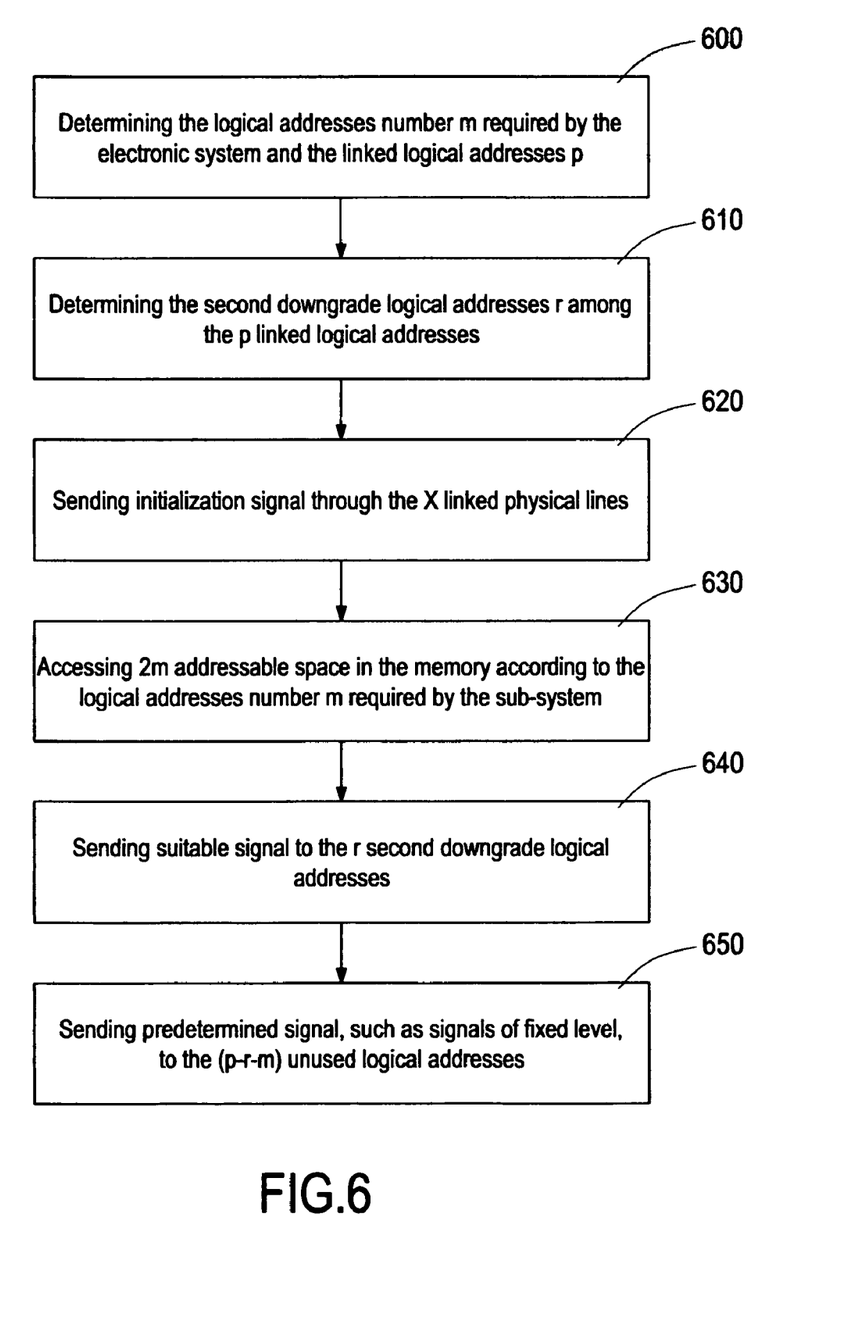
FIG. 6 shows a flowchart according to a preferred embodiment of the present invention.

FIG. 6 shows a flowchart according to a preferred embodiment of the present invention.

Step S600: Determining the logical addresses number m required by the electronic system and the linked logical addresses p.

Step S610: Determining the second downgrade logical addresses r among the p linked logical addresses.

Step S620: Sending initialization signal through the X linked physical lines.

Step S630: Accessing $2^m$ addressable space in the memory according to the logical addresses number m required by the sub-system.

Step S640: Sending suitable signal to the r second downgrade logical addresses.

Step S650: Sending predetermined signal, such as signals of fixed level, to the (p−r−m) unused logical addresses.

Figure 4B:
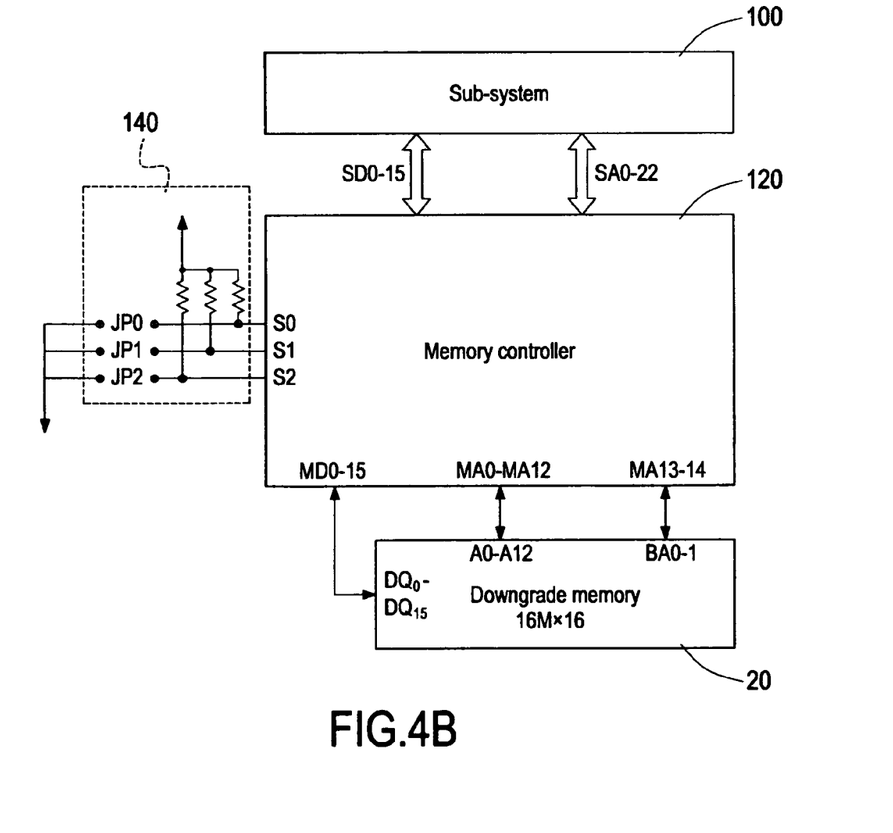
FIG. 4B shows a schematic diagram of a second preferred embodiment of the present invention.

FIG. 4B shows the block diagram according to another preferred embodiment of the present invention, where the sub system 100 is exemplified with a micro controller 100. A recording unit 140 is incorporated to help the memory controller 120 to send correct initialization command and signal conversion according to downgrade type setting of the memory 20.

The recording unit 140 can be any medium with recording function such as jumper, connection status of resistors, EEPROM, record or firmware in micro-controller. The recording unit 140 can be used to indicated the supportable types of downgrade memory for the memory controller 120. For example, the supportable types of downgrade memory can be 4M*16 or 8M*16 memory.

In the second preferred embodiment of the present invention, there is only one memory requester 100 in back-end of the memory controller 120 and the required memory capacity is 8M*16. The memory controller 120 is connected to the memory requester 100 through address lines SA0, SA1 . . . SA22. The memory 20 connected to the front end of the memory controller 120 is an 8M*16 downgrade memory, which is downgraded from a 16M*16 SDRAM. The memory 20 has following six address division ways, where we use BA for representing bank address, RA for representing row address and CA for representing column address. The first division way is CA7=L to indicate a required portion in the non-defect area; the second division way is CA7=H to indicate a required portion in the non-defect area; the third way is RA7=L to indicate a required portion in the non-defect area; the fourth way is RA7=H to indicate a required portion in the non-defect area; the fifth way is CA7=RA7 to indicate a required portion in the non-defect area and the sixth way is CA7=/RA7 to indicate a required portion in the non-defect area, where slash "/" means inverted phase. The physical address lines A0 . . . A12,BA0,BA1 of the memory 20 are connected to the pins MA0 . . . MA14 of the memory controller 120. In this preferred embodiment, the recording unit 140 is realized by connecting three jumpers JP0-JP2 to three control input pins S2, S1 and S0 of the memory controller 120. The skilled in the art would know that the no prior art technology can simulate the downgrade memory with above-mentioned six address division ways into standard 8M*16, even though the downgrade memory with above-mentioned six address division ways has the memory capacity of 8M*16.

The memory controller 120 has following operations according to the present invention. Provided the memory controller 120 sets the CAS Latency=3, Wrap Type being linear Mode, Burst Length=4, then the memory controller 120 sends 0,0,0,0,0,0,0,0,0,1,1,0,0,1,0 for pins MA14 . . . MA0 in MRS command during initialization stage of the memory. Namely, the signals sent to MA1,MA4,MA5 pins are high, and the remaining signals are low, this step can also be referred to the description of S620.

Figure 7A:
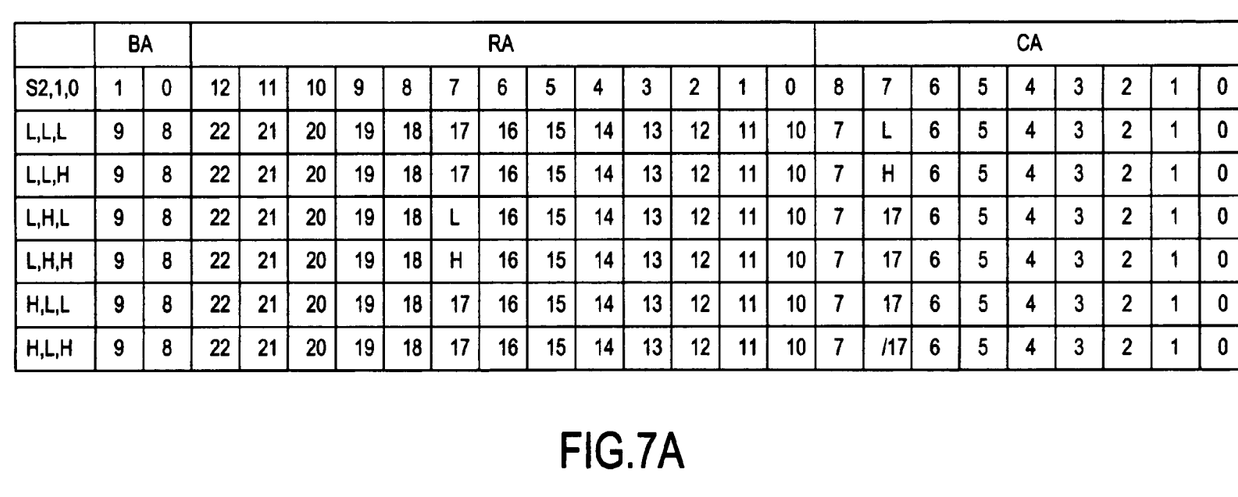
FIG. 7A shows a mapping relationship with reference to the control input pins.

In data accessing stage, the memory controller 120 establishes a mapping relationship between the logical address BA0,BA1,RA0 . . . RA12,CA0 . . . CA8 at front end and the address lines SA0,SA1 . . . SA22 at back end according to the input status of the control input pins S2, S1, S0 and with reference to the relationship in FIG. 7A. As can be seen from this figure, the memory controller 120 establishes a mapping relationship for supporting downgrade memory characterized by CA7=L when the S2,S1,S0 are L,L,L. the memory controller 120 establishes a mapping relationship for supporting downgrade memory characterized by CA7=H when the S2,S1,S0 are L,L,H. The operation for above mapping relationship can also be referred to the description for step S630.

Figure 4C:
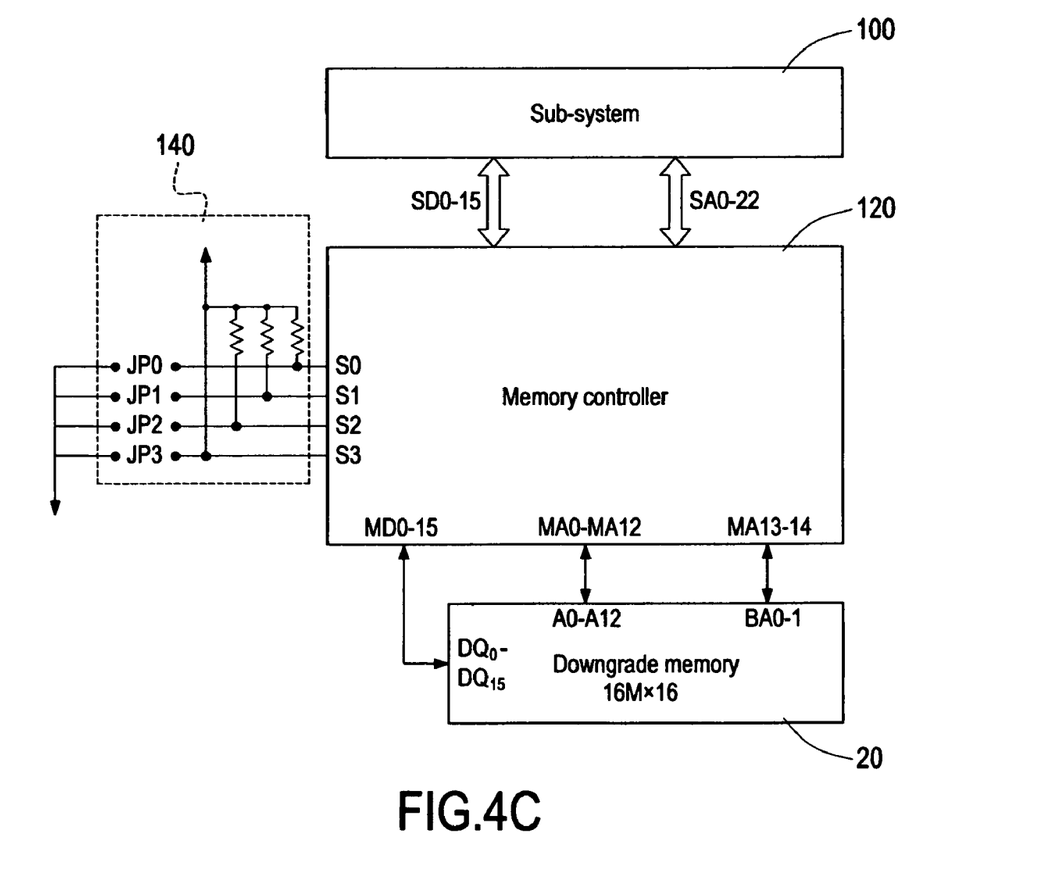
FIG. 4C shows a schematic diagram of a third preferred embodiment of the present invention.
Figure 7B:
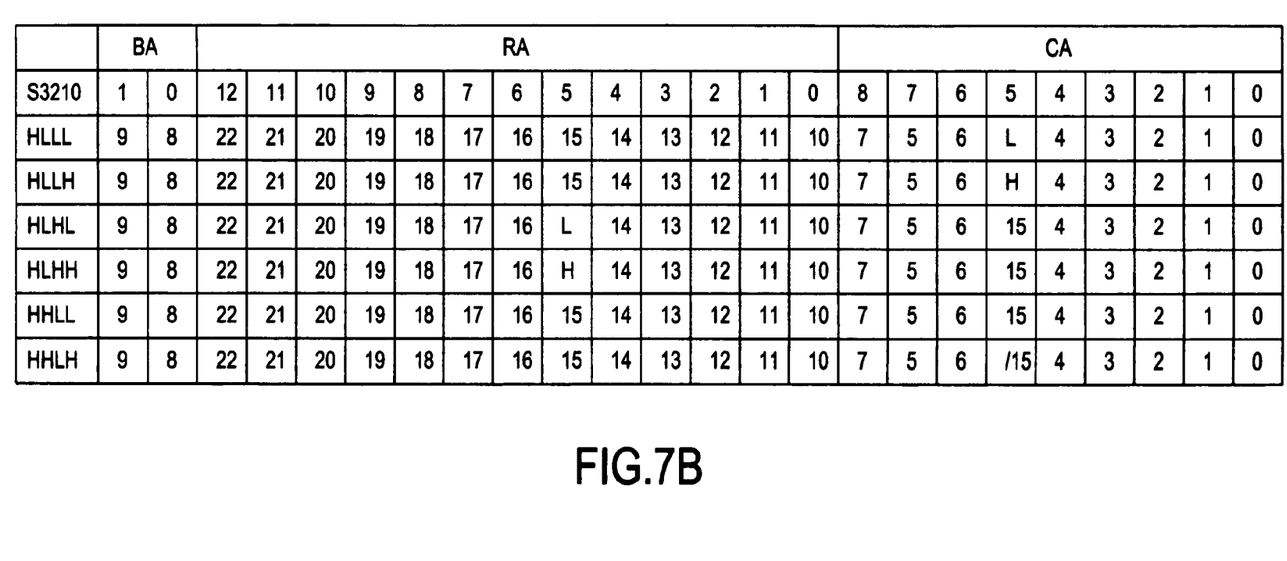
FIG. 7B shows another mapping relationship with reference to the control input pins.

FIG. 4C shows the third preferred embodiment of the present invention, where an additional pin S3 is added to the recording unit 140 for supporting other address division types. When the signal at pin S3 is low, the memory controller 120 can support above-mentioned six address division types. When the signal at pin S3 is high, the memory controller 120 can also support six new address division types. As shown in FIG. 7B, when S3, S2, S1, S0 are H,L,L,L, the CA5=L address division type can be supported. When S3, S2, S1, S0 are H,L,L,H, the CAS=H address division type can be supported. When S3, S2, S1, S0 are H,L,H,L, the RA5=L address division type can be supported. When S3, S2, S1, S0 are H,L,H,H, the RA5=H address division type can be supported. When S3, S2, S1, S0 are H,H,L,L, the CA5=RA5 address division type can be supported. When S3, S2, S1, S0 are H,H,L,H, the CA5=/RA5 address division type can be supported.

As can be seen from above description, the memory controller 120 according to the present invention can support memory of almost any address division type as long as sufficient column address amount is reserved for page size and the column address for burst length is precluded according to the requirement of the requester. Moreover, the prior art downgrade method by address division needs different circuits for different division ways, while the memory controller 120 according to the present invention needs only change mapping relationship of address lines according to the setting of recording unit 140. Therefore, the design complexity is greatly reduced.

As can be seen from the second and the third preferred embodiment, the present invention can be applied to various address division schemes. For those applications with high efficiency and high speed request, the following fourth and the fifth embodiments shows simplifying scheme for increasing the utilization rate of downgrade memory without increasing internal delay.

Figure 4D:
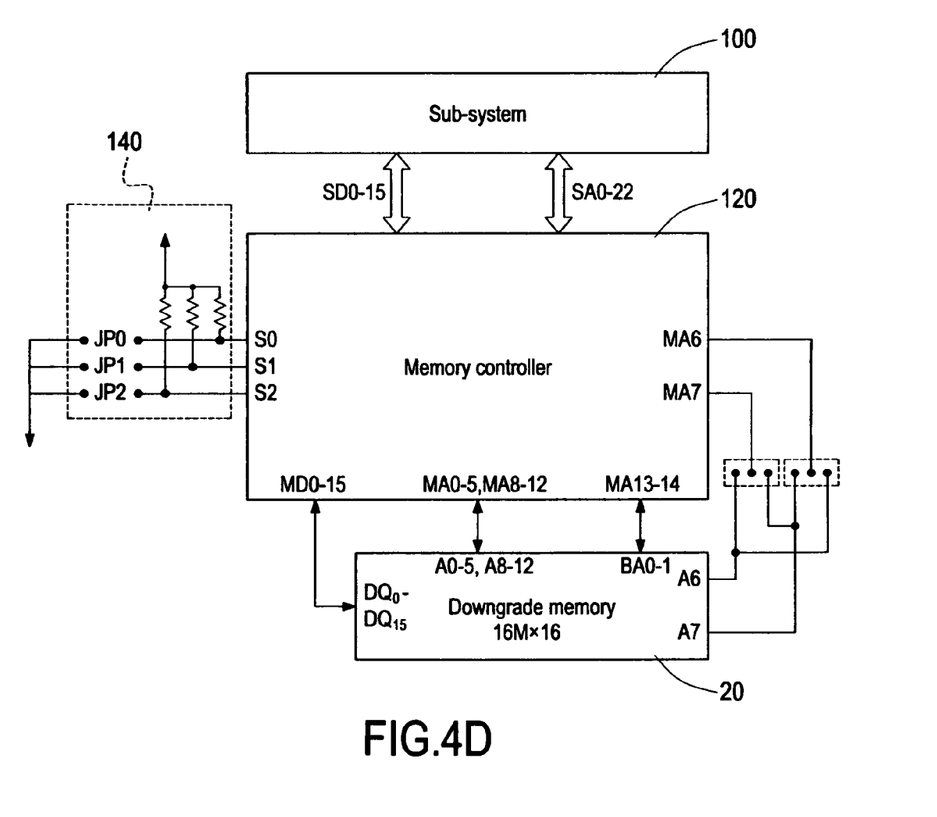
FIG. 4D shows a schematic diagram of a fourth preferred embodiment of the present invention.

FIG. 4D shows the fourth embodiment of the present invention. The memory controller 120 has similar back end as that in the second preferred embodiment However, for the connection between the memory 20 and the memory controller 120, the A6 pin can be selectively connected to MA7 pin and the A7 pin can be selectively connected to the MA6 pin through the connection of external resistor or jumper. Therefore, the address division ways can be expanded to CA6=L, CA6=H, RA6=L, RA6=H, CA6=RA6 and CA6=/RA6 without increasing complexity of memory controller 120.

Figure 4E:
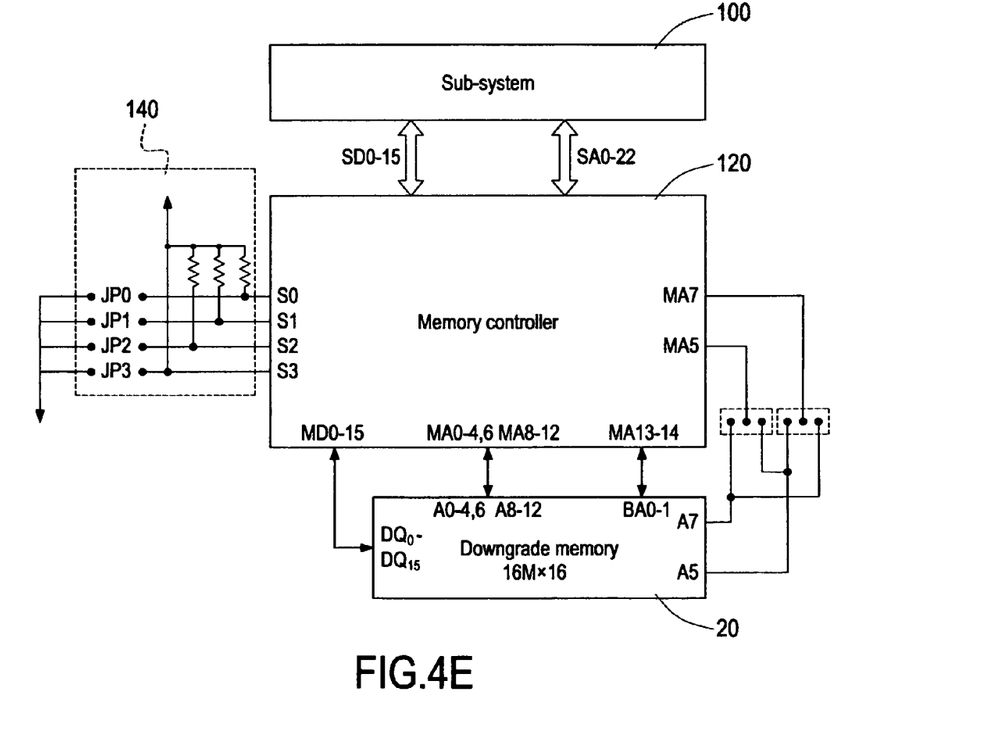
FIG. 4E shows a schematic diagram of a fifth preferred embodiment of the present invention.

FIG. 4E shows the fifth embodiment of the present invention. The fifth embodiment also supports similar downgrade memory with the third embodiment but in different way. In comparison with the third embodiment, the fifth embodiment is added with an identification input pin S3 and the A5 and A7 pins of the memory 20 are connected to the memory controller 120 through the connection of external resistor or jumper. For MRS signal of initialization, when the pins A5 and A7 are connected to the pins MA5 and MA7, the S3 pin is set to be low such that the signals for the pins MA14 ... MA0 are the same as the third embodiment to ensure the memory 20 has received the correct MRS commands. When the signals of the pins A5 and A7 are switched, the signal at the S3 pin is set to be high such that the signals for the pins MA14 ... MA0 are 0,0,0,0,0,0,0,1,0,0,1,0,0,1,0. Therefore, the memory 20 has received the correct MRS commands. The mapping relationship for the front end and back end of the memory controller 120 is independent of the signal at the S3 pin and is the same as that shown in FIG. 7A. Therefore the circuit complexity is transferred to the output logic circuits for initialization. Those output logic circuits for initialization can be set with arbitrary wait state and the overall system accessing is not influenced.

The fifth embodiment of the present invention can be further simplified for system with micro controller. The initialization control can be performed by firmware of the micro controller. Therefore, the input state of the S3 pin can be read by the micro controller and the various MRS signals are provided by firmware to not increase hardware complexity.

The above-mentioned embodiments are exemplified with the mapping relationship between logic address signals of front end and back end in the memory controller 120. However the mapping relationship between logic address signals of front end and back end is just a subset of a generic mapping relationship between front end and back end of the memory controller 120. The concept of the present invention can be easily applied to downgrade memory with non-2' power capacity.

The sixth embodiment of the present invention can be used for a downgrade memory with non-2' power capacity. Provided that there are three memory requesters and each of the memory requesters needs an individual 1M*16 memory capability, the total memory capability needed is 3M*16. In this preferred embodiment, the memory controller 120 comprises two control input pins S1 and S0 to identify and support for 3M*16 downgrade memory, which is downgraded from 8M*16 memory. The memory controller 120 according to the sixth embodiment of the present invention can support following downgrade type. When the signals of the pins S1,S0 are L,L, the memory controller 120 can support a 3M*16 downgrade memory having a required portion in the non-defect area with the pin setting CA8=H AND NOT(RA8=L AND CA7=L). When the signals of the pins S1,S0 are L,H, the memory controller 120 can support a 3M*16 downgrade memory having a required portion in the non-defect area with the pin setting CA8=H AND NOT(RA8=L AND CA7=H). When the signals of the pins S1,S0 are H, L the memory controller 120 can support a 3M*16 downgrade memory having a required portion in the non-defect area with the pin setting CA8=H AND NOT(RA8=H AND CA7=H). Hereinafter the three memory requesters are referred to as RQ0, RQ1, and RQ2. The respective 1M*16 for the memory requesters RQ0, RQ1, and RQ2 form a virtual space of 3M*16. If the three highest addresses in the memory site are selected as CA8, RA8, and CA7, the memory space is divided into eight 1M*16 addressable sub-spaces by the logical addresses CA8, RA8, and CA7. The memory needed by the memory requesters RQ0, RQ1, and RQ2 belong to three memory sub-spaces in the memory space addressable by the logical addresses CA8, RA8, and CA7. Therefore, the memory controller 120 can serve memory request for the memory requesters RQ0, RQ1, and RQ2 as long as the memory controller 120 can establish mapping relationship between three 1M*16 memory locations at memory requester end with three 1M*16 memory sub-spaces at front end of the memory.

In the sixth embodiment of the present invention, the memory controller 120 can one by one map the logical addresses SA19,SA18 ... SA0 of the 1M*16 memory location to the logical addresses BA1,BA0,RA11 ... RA9,RA7, RA6 ... RA0, CA6,CA5 ... CA0 of the front end of the memory. When the signals at pins S1,S0 are L,L and the memory requester RQ0 demands for memory accessing, the signals at the logical addresses CA8,RA8,CA7 are set to be H,H,H; when memory requester RQ1 demands for memory accessing, the signals at the logical addresses CA8,RA8,CA7 are set to be H,L,H; when memory requester RQ2 demands for memory accessing, the signals at the logical addresses CA8,RA8,CA7 are set to be H,H,L. When the signals at pins S1,S0 are L,H and the memory requester RQ0 demands for memory accessing, the signals at the logical addresses CA8, RA8,CA7 are set to be H,L,L; when memory requester RQ1 demands for memory accessing, the signals at the logical addresses CA8,RA8,CA7 are set to be H,H,H; when memory requester RQ2 demands for memory accessing, the signals at the logical addresses CA8,RA8,CA7 are set to be H,H,L. When the signals at pins S1,S0 are H,L and the memory requester RQ0 demands for memory accessing, the signals at the logical addresses CA8,RA8,CA7 are set to be H,L,L; when memory requester RQ1 demands for memory accessing, the signals at the logical addresses CA8,RA8,CA7 are set to be H,L,H; when memory requester RQ2 demands for memory accessing, the signals at the logical addresses CA8, RA8,CA7 are set to be H,H,H. When the signals at pins S1,S0 are H,H and the memory requester RQ0 demands for memory accessing, the signals at the logical addresses CA8,RA8,CA7 are set to be H,L,L; when memory requester RQ1 demands for memory accessing, the signals at the logical addresses CA8,RA8,CA7 are set to be H,L,H; when memory requester RQ2 demands for memory accessing, the signals at the logical addresses CA8,RA8,CA7 are set to be H,H,L.

Figure 8:
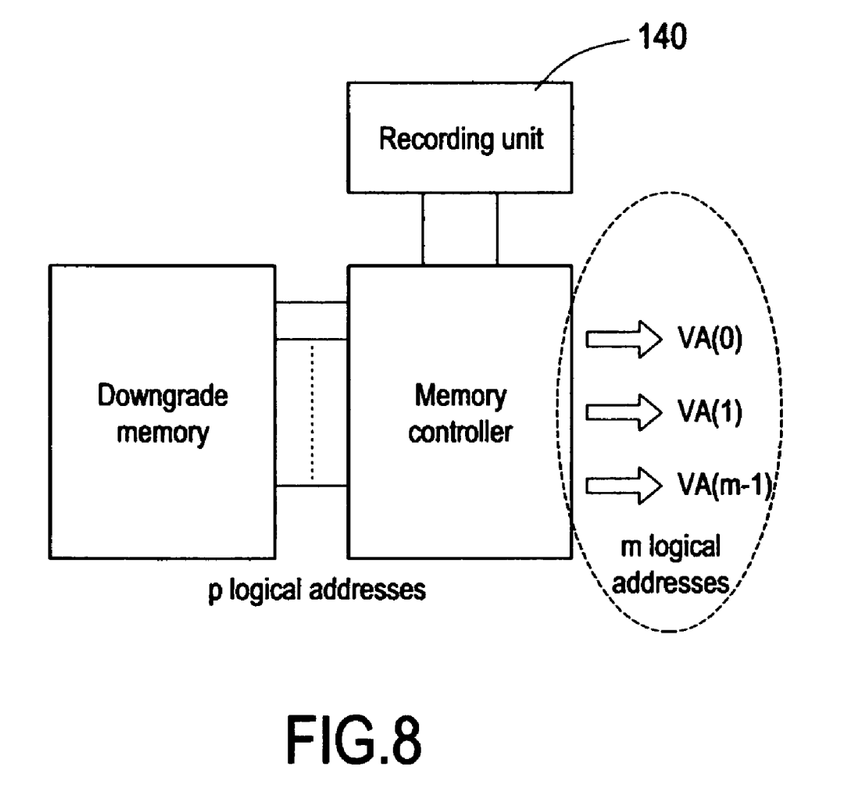
FIG. 8 is a schematic diagram showing the concept of the present invention.

FIG. 8 is a schematic diagram showing the concept of the present invention. The downgrade memory is connected to the memory controller 120 through X physical lines and the X physical lines provide p linked logical addresses, which are larger than m logical addresses requested by system. Therefore, the X physical lines exceed what the system requires and the X physical lines provide memory accessing for downgrade memory of different defect types. By setting the memory controller 120 to access partial physical lines among the X physical lines, the memory controller 120 has flexibility to access different portions in the non-defect area in the downgrade memory of different defect types. On the contrary, the conventional memory controller for downgrade memory is generally connected to the downgrade memory with physical lines having number exactly meeting system requirement. Therefore, the conventional memory controller for downgrade memory can only be used for limited types of downgrade memory. The memory controller 120 according to the present invention has ability to connect to more physical lines and can access downgrade memory of versatile defect types through the help of the recording unit 140. The memory controller 120 according to the present invention can be used for accessing downgrade memory of versatile defect type to reduce cost.

Moreover, to demonstrate the versatile usage of the memory controller 120 according to the present invention, the application of m requested logical addresses are used to address $2^m$ memory units. The actual need might not be $2^m$ memory units and depends on designer choice. The manually assigned memory space for the back end of the memory controller can be generally expressed by a virtual space. When there is only one micro controller, the virtual space is the memory space for the micro controller. When there are different memory requesters at the back end of the memory controller, the memory space required by respective memory requester may be or may not be overlapped and can be manually assigned. The virtual addresses in the virtual space can be indicated by VA(0), VA(1) ... VA(m−1) and can be linked to the m logical addresses one by one through the memory controller 120. For example, if the memory controller 120 according to the present invention is applied to DTV, the virtual addresses in the virtual space are the virtual addresses for the micro processor and the DSP processor, respectively. The memory resource requested by the micro processor and the DSP processor can be provided by accessing a downgrade memory through the memory controller 120 according to the present invention. When the memory resource requested is a non-2's power memory unit, a mapping relationship is established between the virtual space and the addressable memory locations in the memory. Therefore, the usage of memory controller 120 according to the present invention is not limited to what can be achieved by address line division, and can be extended addressable space mapping between back end and front end. The above mentioned 2's power memory unit is also a subset for the addressable space mapping.

Accordingly the memory controller 120 according to the present invention has following advantages:

1. Low cost: The current electronic system has a trend of highly integration such that the memory controllers are almost integrated into other chip. Taking PC as an example, the memory controller for main memory is integrated into North Bridge. In VGA card with AGP interface, the memory controller is integrated into single chip with GPU and AGP controller. The slight elaboration on the memory controller will not increase the cost for chip. However, the overall cost can be reduced because the memory controller 120 according to the present invention has flexibility to access other kinds of downgrade memories.

2. Applicability for high speed environment: The memory controller according to the present invention involves small gate delay between the memory requester and the memory, while the prior art memory controller involves external IO delay for ASIC.

3. Great utilization rate for memory: The downgraded memory used by the memory controller according to the present invention.

Although the present invention has been described with reference to the preferred embodiment thereof, it will be understood that the invention is not limited to the details thereof. Various substitutions and modifications have suggested in the foregoing description, and other will occur to those of ordinary skill in the art. Therefore, all such substitutions and modifications are intended to be embraced within the scope of the invention as defined in the appended claims.

What is claimed is:

1. A memory controller for helping a memory requester to access a downgrade dynamic random accessing memory (DRAM), the downgrade DRAM comprising a defect area and a non-defect area, the memory controller comprising a recording unit for recording at least one of available logical addresses, correct initialization command and a downgrade type setting for the downgrade DRAM, wherein the memory controller is configured for sending initialization signals corresponding to an original memory size to the downgrade DRAM and for accessing a subset of the non-defect area of the downgrade DRAM in address division manner, wherein the subset is of a requested memory size smaller than the original memory size.

2. The memory controller as in claim 1, wherein a logical address number requested by the memory requester is m and a total logical address number of the downgrade memory is originally n, wherein n is larger than m and corresponding to the original memory size.

3. The memory controller as in claim 1, wherein a logical address number requested by the memory requester is m and a logical address number for linked logical addresses associate with the subset is p, wherein the linked logical addresses are corresponding to physical address lines connected to the memory controller, wherein p is larger than m.

4. The memory controller as in claim 2, wherein there are r second downgrade logical addresses in the p linked logical addresses, and r is larger than zero.

5. The memory controller as in claim 4, wherein the memory controller is configured to send predetermined signals to the r second downgrade logical addresses.

6. The memory controller as in claim 4, wherein the memory controller is configured to directly pull high/low the r second downgrade logical addresses corresponding to a downgrade type setting.

7. The memory controller as in claim 1, wherein the recording unit is implemented by jumper, connection status of resistor or EEPROM.

8. The memory controller as in claim 1, further comprising external resistor or jumper to swap at least two pins for the memory controller.

9. The memory controller as in claim 1, wherein the memory requester requests a memory space of non 2's power.

10. An electronic system using a downgrade dynamic random accessing memory (DRAM), the downgrade DRAM comprising a defect area and a non-defect area, the electronic system comprising a memory requester requiring a requested memory space, which is smaller than the non-defect area; and a memory controller comprising a recording unit for recording at least one of available logical addresses, correct initialization command and a downgrade type setting for the downgrade DRAM, wherein the memory controller is configured for sending initialization signals corresponding to an original memory size to the downgrade DRAM and for accessing a subset of the non-defect area of the downgrade DRAM in address division manner, wherein the subset is of a requested memory size smaller than the original memory size.

11. The electronic system as in claim 10, wherein the electronic system requests m logical addresses and the downgrade memory has originally n total logical addresses, wherein n is larger than m and corresponding to the original memory size.

12. The memory module as in claim 10, wherein the electronic system requests m logical addresses and the downgrade memory is linked to the memory controller with p linked logical addresses therebetween, wherein p is larger than m.

13. The electronic system as in claim 10, wherein the memory controller is configured to access the downgrade memory according to a memory subspace required by the electronic system and a pin setting of the downgrade memory.

14. A method for controlling a downgrade dynamic random accessing memory (DRAM) for a memory requester, the downgrade DRAM comprising a defect area and a non-defect area, the memory requester requesting a predetermined requested number of addressable space, the method comprising:

stetting X physical address lines connected to the downgrade memory, wherein the X physical address lines provide p linked logical addresses and $2^p$ is larger than the predetermined requested number;

sending initialization signals corresponding to an original memory size to the downgrade DRAM; and mapping a subset of the p linked logical addresses to the memory requester in address division manner, wherein the original memory size is larger than a memory size of the subset.

15. The method as in claim 14, wherein the predetermined requested number is a non 2's power.

16. The method as in claim 14, further comprising: determining q first downgrade logical addresses for the downgrade memory, which are not accessed through the X physical address lines; sending predetermined signals to the q first downgrade logical addresses.

17. The method as in claim 14, further comprising: determining r second downgrade logical addresses, which are accessed through the X physical address lines; sending predetermined signals to the r second downgrade logical addresses.

* * * * *